United States Patent [19]

White et al.

[11] 4,139,886
[45] Feb. 13, 1979

[54] FAULT TOLERANT SYSTEM FOR BUBBLE MEMORIES

[75] Inventors: Philip E. White, Minneapolis; Robert C. Rust, S. Saint Paul, both of Minn.

[73] Assignee: Control Data Corporation, Minneapolis, Minn.

[21] Appl. No.: 846,290

[22] Filed: Oct. 28, 1977

[51] Int. Cl.² ............................................. G11C 19/08
[52] U.S. Cl. ........................................... 365/1; 365/15
[58] Field of Search ...................................... 365/1, 15

[56] References Cited

U.S. PATENT DOCUMENTS

| 3,909,810 | 9/1975 | Naden et al. | 365/15 |
| 4,073,012 | 2/1978 | Ohnigian | 365/15 |

Primary Examiner—James W. Moffitt
Attorney, Agent, or Firm—William J. McGinnis, Jr.

[57] ABSTRACT

A logic system is disclosed for using a memory device of the serial read type having redundant elements in excess of the nominal memory size and consists of a Programmable Read Only Memory having a defect map programmed into it with respect to the associated memory device, a shift register of a predetermined length equivalent to the maximum number of allowable defects, a multiplexer associated with the shift register, a position counter for controlling the multiplexer and, finally, appropriate logic to control the system. This system is disclosed in connection with a bubble memory system of the field access major loop — minor loop type having extra minor loops. As defects are encountered in writing, data is shifted through the shift register while the multiplexer is incremented to the proper output position of the shift register based on the number of encountered defects. As data is read, an analogous reverse to writing operation is performed with the multiplexer being decremented. In either writing or reading, the multiplexer will never be shifted more than one position for each data bit.

1 Claim, 1 Drawing Figure

FAULT TOLERANT SYSTEM FOR BUBBLE MEMORIES

RELATED APPLICATION DATA

This application is related to two other applications owned by the same assignee as the present application. One application is entitled "Fault Tolerant Bubble Memory with Redundancy Using a Stationary Register on a Single Chip," Ser. No. 841,505, filed on Oct. 12, 1977. The other related application is entitled "Non-circulating Register for Bubble Memory Systems," Ser. No. 841,506, filed on Oct. 12, 1977.

BACKGROUND OF THE INVENTION

The present invention relates to a logic system which may be associated with a memory device containing defects and sufficient additional storage so that the memory may retain its nominal size in the presence of such defects. More particularly, this invention relates to a logic system for use with bubble memories designed in the major loop-minor loop field access arrangement. Specifically, this invention relates to the provision of a Programmable Read Only Memory (PROM) containing a defect map related to the associated memory device, a shift register which may be selectively inserted in the data stream, a position counter associated with a multiplexer to control the output of the shift register through which data passes and logic means to control the device.

Numerous different attempts are found in the prior art to create a certain measure of fault tolerance in memory devices. Many such efforts rely on changes in structure in the memory device so that defective areas may be bypassed. For example, in the bubble memory art there are several patents showing magnetic bubble structures having alterable bubble paths to allow for fault tolerance. Similarly, there are many devices in the memory art showing methods whereby data is stored in a secondary memory and logic is used to selectively replace defective areas of the major or primary memory with the limited storage capacity of the secondary memory. Thus, those logic schemes substitute good memory for bad memory in various ways.

Techniques of adjusting the structure of a bubble memory chip to allow for faults requires significant modification of the basic structure and increased complexity. Furthermore, such chips are in some cases extremely vulnerable to a single defect in certain areas of the memory relating to the logic structure for adjustment in the presence of defects. Thus, although such a memory would tolerate a fault in the memory portion, a fault in the logic portion of the memory would still cause failure. Systems relying on an external memory or secondary memory, combined with logic to make a primary memory usable, are more complex in that there are additional memory devices which must be connected and associated with the primary device.

The present invention relates to a logic system which may be used with a defect map independently of whether or not the defect map is located on the bubble memory chip or whether it is externally located. This invention may be used with a secondary memory flaw map on a single chip with the main bubble memory such as is shown in copending patent application, Ser. No. 841,505.

U.S. Pat. No. 3,792,450 shows a bubble memory chip containing flaw information together with external logic which uses the flaw storage on the bubble chip to implement the fault tolerant design. It has been noted that the invention shown in the subject patent does not have the capability of mapping out or rejecting minor loops in the bubble memory at will. Minor loops are rejected or ignored only if they fail to propagate a bubble around completely. The invention described in this application has the flexibility of mapping out spare or redundant minor loops that are not necessarily defective. It has also been noted that if the control loop shown in the subject patent contains a defect, the bubble memory chip will have to be discarded for the presence of a single error in such locations. With respect to the logic design shown in the subject patent, an entire block of data being written into or read from the storage must be externally buffered in order to maintain a constant stream of read-write data for the memory. A buffer of sufficient size to handle all data is an unnecessary burden. The present application uses a shift register to create the necessary buffering but the invention herein described has the advantage that only as much buffering is required as corresponds to the maximum acceptable number of defective minor loops. Thus, it is not necessary in the present invention to provide buffering capacity equivalent to all good memory minor loops.

SUMMARY OF THE INVENTION

The present invention relates to a logic system to implement a fault tolerant capability in a memory device having redundant memory locations so that a nominal memory size may always be retained in the presence of defects. The present invention uses a memory element such as a Programmable Read Only Memory (PROM), which is initially programmed with fault locations and good locations on the basis of testing the associated memory device. By referring to this memory element as a PROM, no limitation is intended with respect to the PROM being any particular device, semiconductor or otherwise. In fact, in the referenced copending application, the PROM is an internal bubble memory device. A logic device known as a decoder may also be used as the memory element where it contains the logic to identify a defective memory location in response to the memory address.

In various embodiments of the invention, the programmable read only memory may be associated as part of the memory or may be located separately therefrom. Each memory location, corresponding in bubble memory systems to each minor loop, has an associated single bit of programmable read only memory which contains a binary indication of good or defective. Data written into or out of the memory passes through a shift register connected with a multiplexer. For each bit of data read or written, the PROM produces an indication relating to whether that is related to good or defective memory. For data being read into or out of good memory locations the multiplexer does not alter the shift register location through which data is accessed.

During writing, for each defective data location, the multiplexer is incremented by a single shift register location so that the data, to be written builds up in the shift register, since it cannot go to a bad memory location. As data is written into the memory, bad locations receive a forced binary zero, or a no bubble condition in bubble memory systems, data bit while the multiplexer increments the shift register location by one to allow for the artifically generated binary zero.

For a read operation, the shift register is first filled to capacity with the data coming from memory and the multiplexer set to its highest ordered position. Thus, when data is read out of the memory device, defective memory locations have an output which is thrown away while simultaneously the multiplexer is decremented by one location to allow a continuous stream of data to be read. A position counter associated with the PROM is responsible for incrementing and decrementing the multiplexer for defective storage locations during writing and reading, respectively.

IN THE FIGURE

The single drawing figure, FIG. 1 is a logic diagram of an embodiment of the present invention.

DESCRIPTION OF THE PREFERRED EMBODIMENTS

Figure 1:
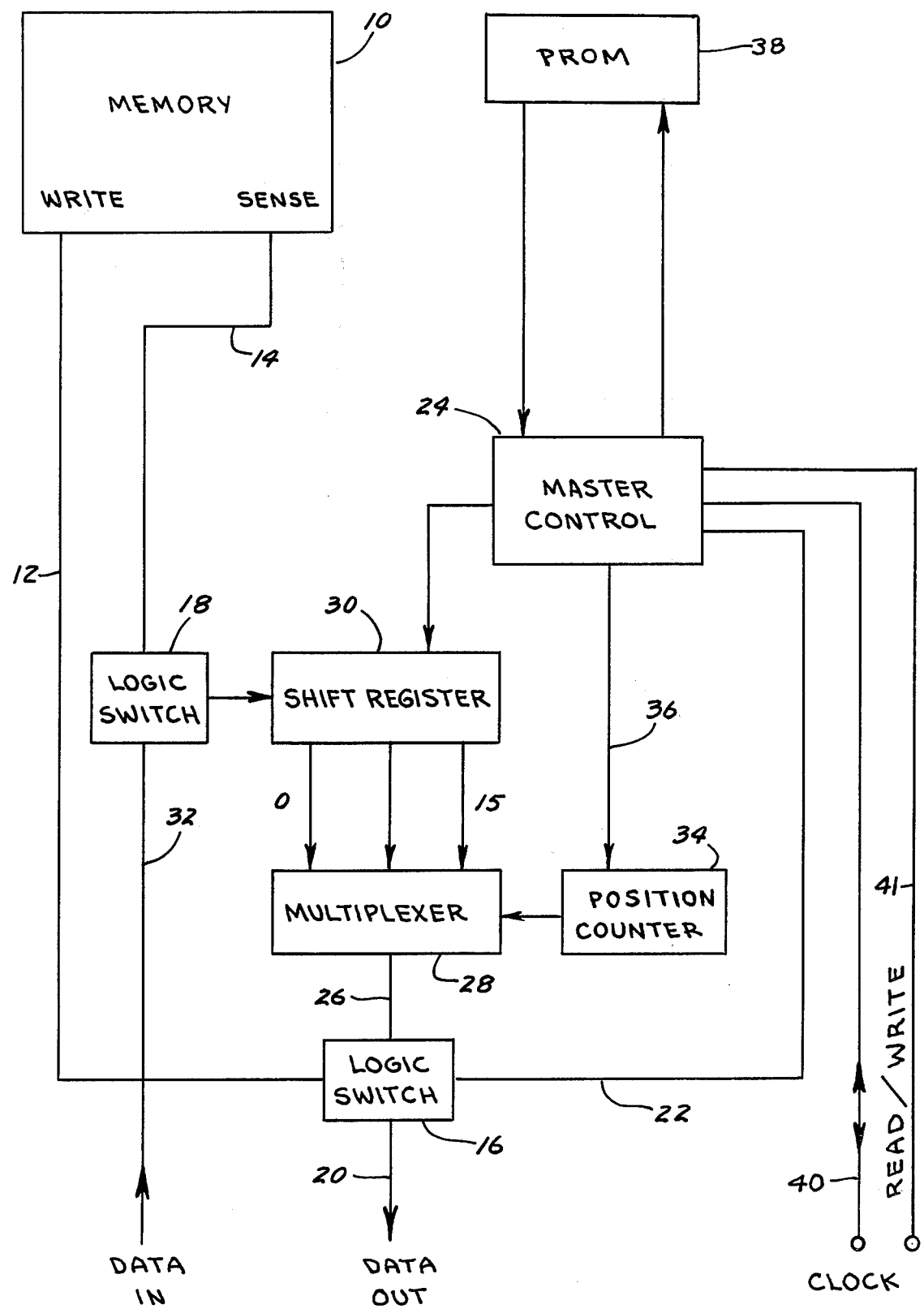

Referring now to FIG. 1, a memory device 10 of conventional design is provided except that additional memory capability is provided so that certain portions of the memory may be defective and yet retain the nominal memory capacity. Such a memory device may consist of a bubble memory device having the well known major loop-minor loop organizational scheme. However, other types of memory may also be used with the present invention so long as they are a type of memory which, in response to a clock signal, generate a serial stream of data when read and receive data for storage in a serial stream. This invention is described with respect to only a single data chip wherein one bit of data is read or written during each time interval. Since normal data processing systems function with data widths of varying capacities, no particular data width is specified in this application, as it would be conventional to make the appropriate number of parallel circuits for each desired bit of the desired channel width in the particular data processing system. The memory device 10 has an input or data write line 12 and an output or data sense line 14.

Data write line 12 is connected with a logic switch 16 and data sense line 14 is connected with a logic switch 18. Logic switch 16 has a data output line 20 and is controlled by a control line 22 which is connected with the master control 24 for the system according to the present invention. Logic switch 16 receives data through a data line 26 connected with a multiplexer 28.

By definition, a multiplexer in a one-bit system has a single output line and a multiplicity of input lines. In response to control signals, particular input lines are selected to be connected to a single output line. For purposes of illustration, it will be presumed that an allowance will be made for up to 15 faulty locations in the memory device 10. Accordingly, a shift register 30, having 16 positions or steps, has 16 outputs, one corresponding to each position of the shift register, connected to 16 input lines of multiplexer 28. One more position is needed in the shift register than the number of possible defects because the register and multiplexer have an initial position (zero position) but have to have the capability of taking as many steps as defects. Thus, the number of steps is one less than the number of positions.

Obviously, the number of faulty memory locations allowed for is not a matter of limitation to this invention, but is a choice of the designer in practicing the invention and any appropriate number of fault locations may be allowed. An allowance of 15 fault locations was considered an appropriate illustrative number in relation to a bubble memory device where a nominal memory capacity of 256 minor loops was desired. Thus, the memory chip as actually constructed would have 271 minor loops so that 15 faulty loops may be eliminated, thus allowing for the nominal memory size of 256. If there are not 15 faulty memory loops, then an additional number of good memory loops will be selected to be eliminated so that a total of 15 are eliminated.

Logic switch 16 receives all of its input data from multiplexer 28 through line 26. If the memory device is operating in the "read" mode, switch 16 provides an output through line 20 or if the device is operating in the "write" mode, switch 16 provides an output to memory 10 through line 12. Similarly, logic switch 18 has a single data input line 32, external to the memory, which is directed to shift register 30 when the memory is in the "write" mode. Logic switch 18 receives the input through data line 14 when the memory is in the "read" mode and provides the input to shift register 30. Thus, shift register 30 and multiplexer 28 are employed both in "read" and "write" modes.

Shift register 30 receives control signals from master control device 24. A position counter 34 controls the multiplexer to determine which bit of the shift register 30 is used to provide an output to data line 26. Position counter 34 receives fault indication control signals through control line 36 connected with master control 24.

A memory element, shown in this embodiment of the invention as programmable read only memory 38, is connected with master control 24 and contains a defect map of the associated memory 10. The programmable read only memory is programmed at the time of initial testing of memory device 10 to identify faulty memory locations and good memory locations and, if necessary, an additional number of good memory locations which are designated as faulty. In response to input clock signals during the "write" mode received on clock line 40, the master control 24 generates address increment signals to PROM 38. As each memory bit is accessed in either the "write" or "read" mode, the PROM address is advanced by one. A signal on input line 41 controls the system to be in either the read mode or the write mode of operation. The output of the PROM may be selected to be zero for good memory and one for bad memory. Whatever convention is used, for each bad memory location identified to master control 24 by PROM 38, the position counter 34 is incremented by one.

The operation of the system may be described in the "read" mode by referring to the stream of data which will be 271 bits in length flowing from the memory 10 through the sense line 14 to the logic switch 18 and finally to shift register 30. The position counter 34 is initially at zero and thus the multiplexer is at channel "0". The PROM is incremented by one for each successive data bit on the input data stream.

For the first 16 cycles, or bits of the data stream which flow at the rate of one per clock cycle, the master control 24 causes the shift register 30 to shift and the position counter 34 to be incremented when the PROM 38 indicates a good data bit is being sensed and leaves both the position counter and the shift register unchanged when the PROM indicates that a bad data bit is being read. In this mode the master control 24 is generating its own internal clock signals but no output clock signals are generated on line 40 during the first 16 cycles of operation.

After the first 16 cycles of operation, clock signals are generated on line 40, master control 24 advances the shift register by one position on good data bits leaving the position counter alone and decrements the position counter 34 by one for bad data leaving the shift register alone. At this time, output data is appearing through the multiplexer 28, logic switch 16, and on the data output line 20 together with clock signals on clock line 40. The result of this process is that the data stream is delayed initially by 16 cycles from the "read" command until output data occurs. Thus, the output data stream is compressed by a similar amount such that the inserted extra data bits to allow for faulty data bits are removed by decrementing the shift register 30.

In the "write" mode, binary zeroes are inserted for each faulty bit location by logic switch 16 in response to command from master control 24. The 256 bit serial stream of input data is presented to shift register 30 through data input line 32 and logic switch 18. Both position counter 34 and PROM 38 start in a cleared or zero condition. As before, PROM 38 is continuously advanced by one memory address location during the entire "write" operation which for the memory device 10 is the 271 data bits, although the input data stream on line 32 only contains 256 bits. When the output from the PROM 38 indicates a good bit position, multiplexer 28 provides the output to the memory through line 26 and logic switch 16 into memory write line 12. When a bad memory location is indicated by PROM 38, an arbitrary binary zero is used as the data output bit to memory device 10. At the time PROM 38 indicates a bad memory location, the position counter 34 is advanced by one count so that the multiplexer 28 connects with a different position in the shift register 30. The shift register 30 is advanced for each input data cycle.

What is claimed is:

1. A fault tolerant system for bubble memories comprising:
    a major loop — minor loop bubble memory having additional minor loops so that nominal memory size is retained in the presence of defects,
    a memory element containing a defect map of said bubble memory,
    a shift register of a predetermined length related to the maximum number of allowable bubble memory defects,
    a multiplexor having its input lines connected to the content locations of the shift register,
    a position counter connected to the multiplexor for controlling the selected input from the shift register, and
    a master control device connected with said memory element, said shift register and said position counter for controlling the flow of data read from or written into said bubble memory,
    said master control, during a writting operation, causing the shift register to be shifted for each input data cycle and causing the position counter to be incremented for each bad memory location to be written while the shift register remains unchanged, and
    wherein said master control, during a read operation, causing the shift register to be filled to capacity when data comes from memory with the position counter initially set for its maximum numbered position and when the shift register is filled to capacity said master control causing said shift register to be shifted for each good data bit from memory and said position counter decremented for each bad data bit from memory.

* * * * *